United States Patent [19]

Kawazu et al.

[11] Patent Number: 5,535,699
[45] Date of Patent: Jul. 16, 1996

[54] METHOD OF MAKING II-VI SEMICONDUCTOR INFRARED LIGHT DETECTOR

[75] Inventors: Zempei Kawazu; Akihiro Takami, both of Itami, Japan

[73] Assignee: Mitsubishi Denki Kabushiki Kaisha, Tokyo, Japan

[21] Appl. No.: 418,886

[22] Filed: Apr. 7, 1995

Related U.S. Application Data

[62] Division of Ser. No. 185,015, Jan. 24, 1994, abandoned.

[30] Foreign Application Priority Data

May 31, 1993 [JP] Japan ................................. 5-128622

[51] Int. Cl.$^6$ ................................................ C30B 25/04
[52] U.S. Cl. ................... 117/1; 117/54; 117/957; 437/91
[58] Field of Search ..................... 117/1, 54, 61, 117/200, 204, 937, 957; 148/171; 422/253; 423/99; 437/3, 91, 92, 119

[56] References Cited

U.S. PATENT DOCUMENTS

| | | | |
|---|---|---|---|
| 4,317,689 | 3/1982 | Bowers et al. | 437/120 |
| 4,578,126 | 3/1986 | Rezek et al. | 148/171 |
| 4,755,364 | 7/1988 | LaChapelle, Jr. et al. | 422/253 |
| 5,198,370 | 3/1993 | Ohkura et al. | 437/3 |

FOREIGN PATENT DOCUMENTS 2-129098  5/1990  Japan.

OTHER PUBLICATIONS

Astles et al, "Improved Control Of Composition And Electrical Properties Of Liquid Phase Epitaxial (CdHg)Te Layers", Journal of Crystal Growth 117, 1992, pp. 213–217.

Yoshikawa et al, "The Behavior Of Oxygen In HgCdTe", Journal of Vacuum Science Technology, vol. A3, No. 1, 1985, pp. 153–155.

Lapides et al, "The Characterization Of Intentional Dopants In HgCdTe Using SIMS, Hall-Effect, And C–V Measurements", Mat. Res. Soc. Symp. Proc. vol. 48, 1985, pp. 365–375.

Primary Examiner—R. Bruce Breneman
Assistant Examiner—FeLisa C. Garrett
Attorney, Agent, or Firm—Leydig, Voit & Mayer

[57] ABSTRACT

A method for producing a photo-voltaic infrared detector including growing a crystalline CdHgTe layer on a CdTe substrate by liquid phase epitaxy using a growth melt including tellurium as a solvent to which indium is added as a dopant impurity in a concentration of from 0.01 to 0.1 ppm; annealing the CdHgTe layer to produce a p-type CdHgTe layer including indium as an n-type background dopant impurity; forming an n-type region of a desired depth as a light receiving region at the surface of the p-type CdHgTe layer by implanting a dopant impurity producing n-type conductivity and annealing; and forming an n-side electrode on the n-type region and a p-side electrode a prescribed distance from the n-type region on the p-type CdHgTe layer.

1 Claim, 18 Drawing Sheets

METHOD OF MAKING II-VI SEMICONDUCTOR INFRARED LIGHT DETECTOR

This disclosure is a divisional of application Ser. No. 08/185,015, filed Jan. 24, 1994, now abandoned.

FIELD OF THE INVENTION

The present invention relates to production of cadmium mercury telluride crystals and production of an infrared detector and, more particularly, to methods for producing an n-type CdHgTe crystal used as a material for producing a photo-conductive type infrared detector and a p-type CdHgTe crystal used as a material for producing a photo-voltaic type infrared detector, and also to methods of producing infrared detectors using these CdHgTe crystals.

BACKGROUND OF THE INVENTION

Conventionally, CdHgTe is used as a material for an infrared detector, and, particularly, n-type CdHgTe is utilized as a material for a photo-conductive type infrared detector because it has a large photo-conductive effect that increases its conductivity due to the incidence of light. At present, an infrared detector that is obtained by epitaxially growing CdHgTe on a cadmium telluride substrate or on a cadmium zinc telluride ($Cd_xZn_{1-x}Te$: x=0.93 to 0.95) substrate is used for a photo-conductive type infrared detector.

FIG. 15(a) is a cross-sectional view schematically illustrating a structure of a prior art photo-conductive type infrared detector, and FIG. 15(b) is a cross-sectional view illustrating a structure of a material substrate used for producing the photo-conductive type infrared detector. In the figures, reference numeral 201 designates a material substrate used for producing a photo-conductive type infrared detector (hereinafter referred to as "PC element material substrate"), and this PC element material substrate 201 comprises a CdTe substrate 3 and an n-type CdHgTe layer 11 epitaxially grown on the substrate 3. A PC-type infrared detector 201a is fabricated by using the PC element material substrate 201, Where a passivation film 22 and a ZnS reflection preventing film 23 are successively deposited on a light receiving region 201b at the surface of the n-type CdHgTe crystal 11, and Au electrodes 21 are produced at the both sides of the light receiving region 201b.

FIGS. 16(a) to 16(c) show a schematic construction of a liquid phase epitaxy apparatus and a growth method for growth of CdHgTe crystal. In the figures, reference numeral 4 designates a lower boat having a substrate mounting concave part 4a for mounting a crystal growth substrate, i.e., the CdTe substrate 3. An upper boat 5 including growth melt 8 and moving the same is slidably disposed on the lower boat 4, and a lid member 6 which can airtightly seal the upper boat 5 is attached to an upper aperture of the upper boat 5. The growth melt 8 comprises Te as solvent in which Cd and Hg as medium are dissolved in the proportion of 2 to 8. Reference numeral 10 designates an as-grown CdHgTe crystal, i.e., a CdHgTe crystal immediately after being grown on the CdTe substrate 3 by liquid phase epitaxy, that has not been annealed.

FIGS. 17(a) and 17(b) are diagrams for explaining a method of annealing the above described as-grown CdHgTe crystal 10. In the figures, reference numeral 31a designates an annealing furnace for annealing the as-grown CdHgTe crystal 10 that has a temperature distribution shown in FIG. 17(b). A quartz ampule 32 which will be thrown away after the usage is used for sealing the CdTe substrate 3 on which the as-grown CdHgTe crystal 10 is grown in a substrate containing part 32a and also sealing mercury 9 in a mercury containing part 32b. This quartz ampule 32 has a constricted part 32c for preventing the movement of the mercury at its one end side partitioning the mercury containing part 32b and the substrate containing part 32a.

A description is given of a prior art production method of an n-type $Cd_{0.2}Hg_{0.8}Te$ crystal and a production method of the photo-conductive type infrared detector.

First of all, the CdTe substrate 3 is disposed in the substrate mounting concave part 4a of the lower boat 4, the upper boat 5 is positioned at one side of the lower boat 4, the growth melt 8 is put in the upper boat 5, and the lid member 6 is placed to airtightly seal the upper boat 5. Thereafter, the whole of the boat is heated to about 500° C. in a hydrogen ambient, thereby melting the growth melt 8 in the upper boat 5 (FIG. 16(a)).

Subsequently, the whole is cooled down to a prescribed temperature, i.e., 480° C. at a constant cooling rate, and the upper boat 5 is moved by sliding to a position above the CdTe substrate 3 from the side portion of the lower boat 4 as shown in FIG. 16(b). Thus, the melted growth melt 8 covers the surface of the CdTe substrate 3, and the CdHgTe crystal 10 is epitaxially grown on the CdTe substrate 3.

After a prescribed time passes, the upper boat 5 is moved by sliding to the other side of the lower boat 4 from the position above the CdTe substrate 3, thereby completing the crystal growth of CdHgTe (FIG. 16(c)).

Since the above described CdHgTe crystal includes mercury which has a quite high vapor pressure as a constitutional element, it is quite likely to generate mercury vacancies in the crystal, thereby easily deviating from stoichiometry, i.e., the ratio of Cd to Hg in the Te solvent (0.2:0.8), so that these mercury vacancies behave as acceptors in the CdHgTe crystal. Accordingly, the as-grown CdHgTe layer 10 grown as described above becomes a p-type semiconductor layer having a carrier concentration of about $10^{16}$ to $10^{17}$ $cm^{-3}$ due to the mercury vacancies generated during its growth.

Because the p-type CdHgTe layer does not have so large a photo-conductive effect, this layer should be converted to n-type to be used as a material of a photo-conductive type infrared detector. Particularly, it is suggested in Material Research Society Symposium Proceeding Vol. 90 (1987) pp. 15, that the n-type carrier concentration of the material substrate should be below $10^{15}$ $cm^{-3}$ to realize the photo-conductive type infrared detector.

From the above described reason, the as-grown CdHgTe crystal 10 obtained by liquid phase epitaxy is converted to an n-type CdHgTe crystal having a carrier concentration of $10^{14}$ $cm^{-3}$ order by annealing. The annealing method of the as-grown CdHgTe crystal will be described in the following.

First of all, a CdTe substrate 3 on which the CdHgTe crystal 10 is grown by liquid phase epitaxy and mercury 9 are sealed in vacuum in the quartz ampule 32 as shown in FIG. 17(a), and this quartz ampule 32 is placed in the annealing furnace 31a having a temperature distribution as shown in FIG. 17(b), where the abscissa is positioned in the furnace in the longitudinal direction and the ordinate is temperature, thereby performing an annealing.

Then, the mercury partial pressure generated by evaporation of the mercury 9 is applied to the as-grown CdHgTe crystal 10, and the mercury atoms are diffused into the as-grown CdHgTe crystal 10. Therefore, the mercury vacancies in the crystal 10 are not only filled but the mercury atoms enter into the crystal as an n-type impurity, thereby converting the conductivity type of the as-grown CdHgTe crystal 10 from p-type to n-type. The annealing conditions are established so that the n-type carrier concentration of the CdHgTe crystal is set to a low value of $10^{14}$ cm$^{-3}$ order. Thus, by a simple processing of only annealing the as-grown CdHgTe crystal 10 in the mercury ambient, an n-type $Cd_{0.2}Hg_{0.8}Te$ crystal 11 appropriate for producing a photo-conductive type infrared detector is obtained.

Then, a passivation film 22 is produced by anodic oxidation of the light receiving region 201b of the n-type CdHgTe layer 11, and the ZnS reflection preventing film is produced, and thereafter the Au electrodes 21 are produced at both sides of the light receiving region 201b, thereby completing the photo-conductive type infrared detector 201 shown in FIG. 15(a).

A description of a photo-voltaic type infrared detector and a material for producing the same will be described in the following.

FIG. 18(a) is a cross-sectional view illustrating a structure of a prior art photo-voltaic type infrared detector, and FIG. 18(b) is a cross-sectional view illustrating a structure of a material substrate used for producing the photo-voltaic type infrared detector of FIG. 18(a). In the figures, reference numeral 202 designates a material substrate for producing a photo-voltaic type infrared detector (hereinafter referred to as "PV element material substrate"). This material substrate 202 comprises a CdTe substrate 3 and a p-type CdHgTe layer 12 epitaxially grown thereon.

Reference numeral 202a designates a PV-type infrared detector fabricated using the PV element material substrate 202, and this is usually used with a reverse bias of about 50 mV being applied. An n-type CdHgTe region 24 is produced at the surface of the p-type CdHgTe layer 12 of the PV-type infrared detector 202a by ion implantation, and a pn junction surface 24a is produced at the interface between the region 24 and the p-type CdHgTe layer 12. An insulating film 25, which also serves as an ion implantation mask, is produced on the surface of the p-type CdHgTe layer 12. An n-side electrode 26a having a two-layer structure comprising a lower Cr layer and an upper Au layer is formed on the n-type CdHgTe region 24. A p-side electrode 26b comprising Au is formed at a position spaced a prescribed distance apart from the n-type CdHgTe region 24 on the p-type CdHgTe layer 12.

FIGS. 19(a) and 19(b) show a method of annealing CdHgTe as disclosed in, for example, Japanese Published Patent Application Hei No. 1-148799. In the figures, reference numeral 31b designates an annealing furnace for annealing the as-grown CdHgTe crystal 10, having a temperature distribution as shown in FIG. 19(b). A quartz ampule 33 which will be thrown away after the usage is used for vacuum-sealing the CdTe substrate 3 on which the as-grown CdHgTe crystal 10 is produced.

A description is given of a prior art production method of the p-type CdHgTe crystal and a production method of the photo-voltaic type infrared detector.

First of all, similar to producing the n-type CdHgTe crystal, after producing the as-grown CdHgTe layer 10 by growing CdHgTe on the CdTe substrate 3 as shown in FIGS. 19(a) to 19(c), the CdTe substrate 3 is sealed in vacuum in the quartz ampule 33, and this quartz ampule 33 is contained in the annealing furnace 31b having a uniform temperature profile as shown in FIG. 19(b), where the abscissa is distance and the ordinate is temperature. Thereafter, an annealing of the as-grown CdHgTe crystal 10 is performed, whereby the p-type CdHgTe crystal 12 used for producing the photo-voltaic type infrared detector 202 is obtained.

Thereafter, after the insulating film 25 of a prescribed pattern is formed on the surface of the p-type CdHgTe crystal 12 obtained by the above described LPE method, ion implantation is carried out using boron or the like as an n-type impurity using the insulating film 25 as a mask, thereby selectively producing the n-type CdHgTe region 24. Thereafter, the n-side electrode 26a having a laminated structure of Cr/Au is formed on the n-type CdHgTe region 24, and the p-side electrode 26b comprising Au is formed at a portion in the vicinity of the n-type CdHgTe region 24 on the p-type CdHgTe crystal 12. Thereby, the photo-voltaic type infrared detector 202a shown in FIG. 18(a) is obtained.

In this photo-voltaic type infrared detector 202a, carriers which are generated in the p-type CdHgTe crystal 12 due to the incidence of infrared light are captured at the pn junction 24a, and they are taken out as a signal from the n-side electrode 26a, thereby detecting the infrared light.

Among the factors determining the performance of the above described infrared detector 202a, one of the most important is a dark current. As the dark current is lower, the signal to noise ratio (S per N ratio) of the infrared detector can be higher.

Generally, in an ideally produced infrared detector, a dark current is determined by the diffusion current generated by minority carriers which diffuse to the depletion layer and the generated and recombination current that is generated via the traps existing in the depletion layer. In the prior art photovoltaic type infrared detector 202a, the n-type CdHgTe region 24 is produced by ion implantation, and a region including defects generated by the ion implantation exists in the vicinity of the pn junction 24a, and therefore the influences of the generated and recombination current in this defective region on the characteristics of the infrared detector are large, thereby deteriorating the performance of the detector.

It is suggested in Journal of Vacuum Science and Technology A5(5), (1987) 3166, that due to the existence of n-type background impurities, i.e., impurities having a concentration not enough to determine the conductivity type in the p-type semiconductor layer, a pn junction can be produced at a deep position in the p-type semiconductor layer, i.e., at a position spaced from the surface, and a structure in which the conductivity type changes in the order of n-type, $n^-$-type and p-type from the surface is realized. Therefore, the pn junction can be produced at a region spaced from the region that includes defects due to the ion implantation.

In other words, when ion implantation of an n-type impurity is carried out into an as-grown CdHgTe crystal including n-type background impurities, the mercury atoms in the vicinity of the surface are expelled from the lattice, and they may be present in the CdHgTe crystal as interstital mercury at a position deeper than the region where implanted elements are present.

By the annealing after ion implantation, the above described interstitial mercury atoms are diffused to the inside of the crystal so as to fill mercury vacancies. Therefore, the concentration of mercury vacancies at a deep portion in the CdHgTe crystal is decreased, and the conductivity type at this portion is controlled by the added background impurities and inverted to $n^-$-type, thereby producing a pn junction at a position spaced from the surface of the CdHgTe crystal (refer to FIG. 11).

By employing the background impurity as described above, the pn junction 24a is not produced by ion implantation, but is produced by the diffusion of the interstitial mercury generated by the ion implantation, and therefore the pn junction 24a is produced at a deep region in the CdHgTe crystal where almost no defects generated by the ion implantation exist, thereby reducing the generated and recombination current by a large margin.

In the prior art production method of an n-type CdHgTe crystal, although the deviation from stoichiometry is controlled by the annealing of the undoped crystal in the mercury ambient thereby to control the n-type carrier concentration to about $10^{14}$ cm$^{-3}$, it is difficult to completely control the stoichiometry because of the fluctuations in the furnace temperature and the variations in the degree of sealed vacuum, whereby the n-type carrier concentration largely varies from run-to-run, i.e., for each production of the n-type CdHgTe crystal, resulting in difficulty in producing an n-type CdHgTe crystal of a constant n-type carrier concentration at high yield.

In the prior art growth method of a p-type CdHgTe crystal, because there is no disclosure of the quantity of the background impurity to be added in the above-described reference, it is difficult to obtain a p-type CdHgTe crystal including background impurities and having a pn junction with a depth position that can be controlled stably.

SUMMARY OF THE INVENTION

It is an object of the present invention to provide a producing n-type CdHgTe crystal having a carrier concentration of $10^{14}$ cm$^{-3}$ order with less variations in the carrier concentration and at high yield.

It is another object of the present invention to provide a production method of an infrared detector that produces a photo-conductive type infrared detector at high yield.

It is a still another object of the present invention to provide a production method of a cadmium mercury telluride crystal that produces a p-type CdHgTe crystal including background impurities with a stably-controlled pn junction depth in the crystal reproducibly.

It is a further object of the present invention to provide a production method of an infrared detector that produces a photo-voltaic type infrared detector at high yield.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, production of a CdHgTe crystal includes growing an n-type CdHgTe crystal on a CdTe substrate by liquid phase epitaxy using a melt including Te as a solvent and Hg and Cd as solutes to which indium as an n-type impurity is added to 0.01 ppm, and thereafter annealing the CdHgTe crystal in a mercury ambient so as to have a carrier concentration of 3 to 6×$10^{14}$ cm$^{-3}$, thereby producing an n-type $Cd_{0.2}Hg_{0.8}Te$ crystal. Therefore, the mercury atoms are diffused into the CdHgTe crystal from the mercury ambient during the annealing and the indium taken into the CdHgTe crystal during growth is activated as an n-type impurity thereby to determine the n-type carrier concentration. Therefore, the n-type carrier concentration of the n-type CdHgTe crystal can be controlled by the indium addition within a range of 3×$10^{14}$ cm$^{-3}$ to 6×$10^{14}$ cm$^{-3}$ with high reproducibility without being affected by deviations in the annealing conditions.

According to a second aspect of the present invention, production of a photo-conductive type infrared detector includes growing a CdHgTe layer on a CdTe substrate by liquid phase epitaxy using a melt including Te as a solvent and Hg and Cd as solutes to which indium as an n-type impurity is added to 0.01 ppm, and thereafter annealing the CdHgTe layer in a mercury ambient so as to have a carrier concentration of 3 to 6×$10^{14}$ cm$^{-3}$, thereby producing an n-type $Cd_{0.2}Hg_{0.8}Te$ layer, and producing electrodes at both sides of a portion serving as a light receiving region on this n-type $Cd_{0.2}Hg_{0.8}Te$ layer. Because the PC-type infrared detector is fabricated by using the n-type CdHgTe layer whose n-type carrier concentration is determined by the indium taken in during the crystal growth, the PC-type infrared detector is produced on the n-type CdHgTe layer having fewer variations in the n-type carrier concentration, thereby enhancing the yield.

According to a third aspect of the present invention, production of a CdHgTe crystal includes growing a CdHgTe crystal on a semiconductor substrate by liquid phase epitaxy using a melt including Te as a solvent and Hg and Cd as solutes to which indium as an n-type impurity is added to 0.01 to 0.1 ppm, and thereafter annealing the CdHgTe crystal in vacuum, thereby producing a p-type $Cd_{0.2}Hg_{0.8}Te$ crystal including indium as a background impurity. Therefore, the concentration of the n-type background impurity is higher than the carrier concentration of the intrinsic semiconductor in the p-type CdHgTe crystal, and is smaller than the p-type carrier concentration, whereby the p-type $Cd_{0.2}Hg_{0.8}Te$ crystal including indium as a background impurity can be fabricated with high reproducibility.

According to a fourth aspect of the present invention, production of an infrared detector includes growing a CdHgTe crystal on a semiconductor substrate by liquid phase epitaxy using a melt including Te as a solvent and Hg and Cd as solutes to which indium as an n-type impurity is added to 0.01 to 0.1 ppm, annealing the above described CdHgTe crystal thereby producing a p-type $Cd_{0.2}Hg_{0.8}Te$ crystal including indium as a background impurity, thereafter implanting n-type impurity ions followed by annealing, thereby producing an n-type region of a desired depth constituting a light receiving region at the surface of the p-type CdHgTe layer, and producing an n-side electrode on the n-type region and a p-side electrode spaced a prescribed distance from the n-type region of the p-type CdHgTe layer. Because the PV-type infrared detector is fabricated using the p-type CdHgTe crystal that is produced by using the growth melt to which indium is added to 0.01 to 0.1 ppm as an n-type background impurity, a pn junction that is formed by ion implantation of n-type impurity can be positioned at a desired depth in the p-type CdHgTe layer with high reproducibility, whereby a PV-type infrared detector with improved characteristics is obtained at high yield.

DETAILED DESCRIPTION OF THE PREFERRED EMBODIMENTS

Embodiment 1

Figure 1:
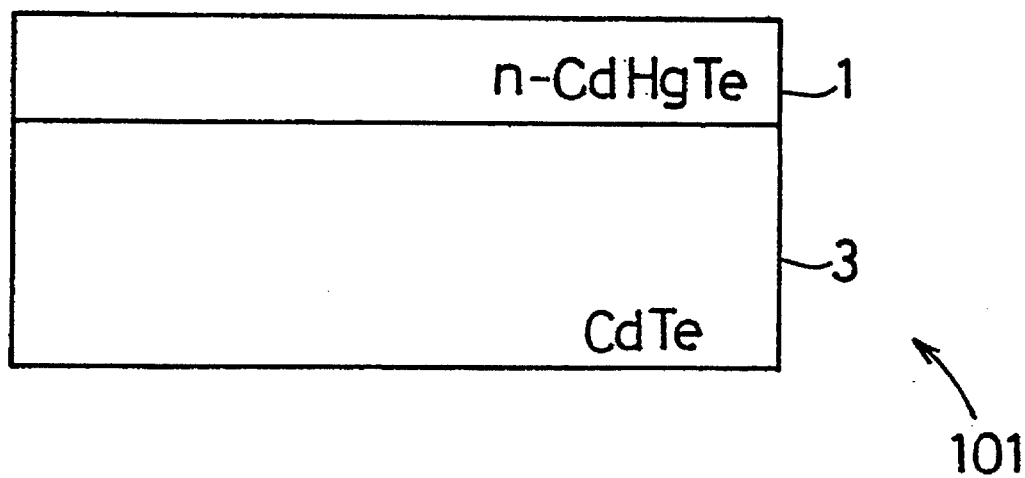
FIG. 1 is a cross-sectional view illustrating a structure of a PC element material substrate produced in accordance with a first embodiment of the present invention.

FIG. 1 illustrates a material substrate of a photo-conductive type infrared detector produced by production of cadmium mercury telluride crystals according to a first embodiment of the present invention. In the figure, reference numeral 101 designates a material substrate for producing a photo-conductive type infrared detector (hereinafter referred to as "PC element material substrate"), and this comprises a CdTe substrate 3 and an n-type CdHgTe crystal 1 including indium produced on the substrate.

Figure 2A:
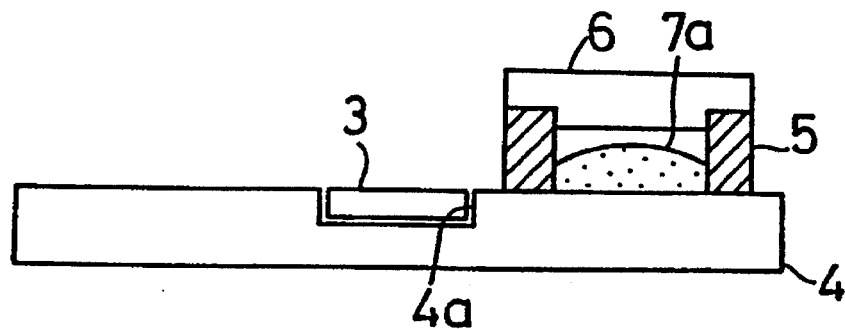
FIGS. 2(a)–2(c) are diagrams illustrating a process for epitaxially growing CdHgTe crystal including indium on a CdTe substrate, in the production of the PC element material substrate.
Figure 2B:
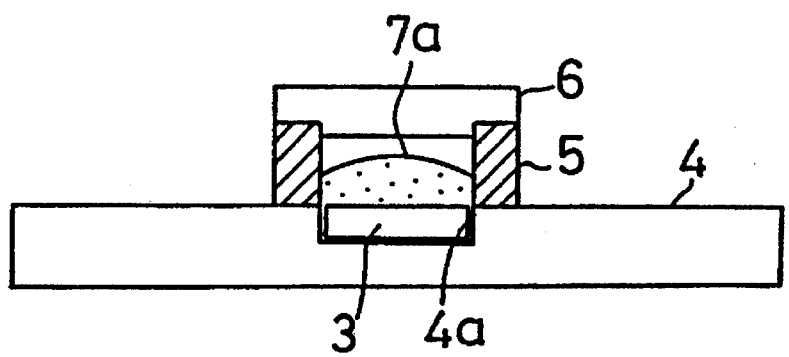
Figure 2C:
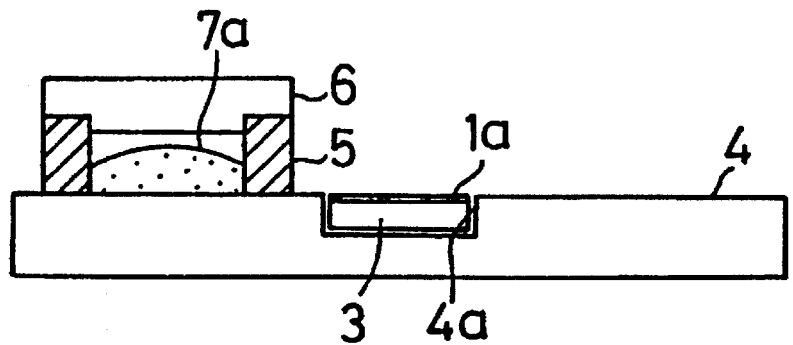
Figure 3A:
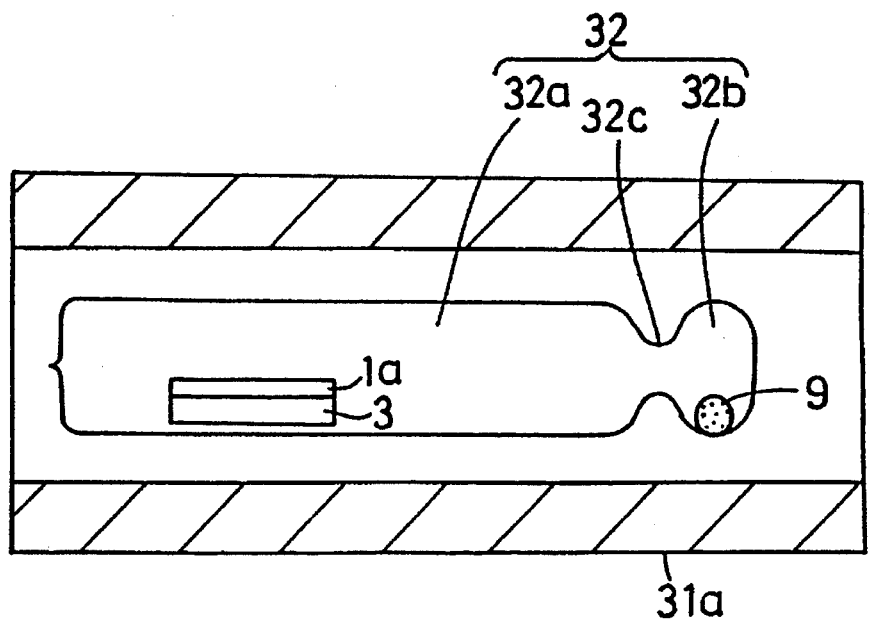
FIGS. 3(a) and 3(b) are diagrams illustrating a process for annealing an as-grown CdHgTe crystal including indium on the CdTe substrate, in the production of the PC element material substrate.
Figure 3B:
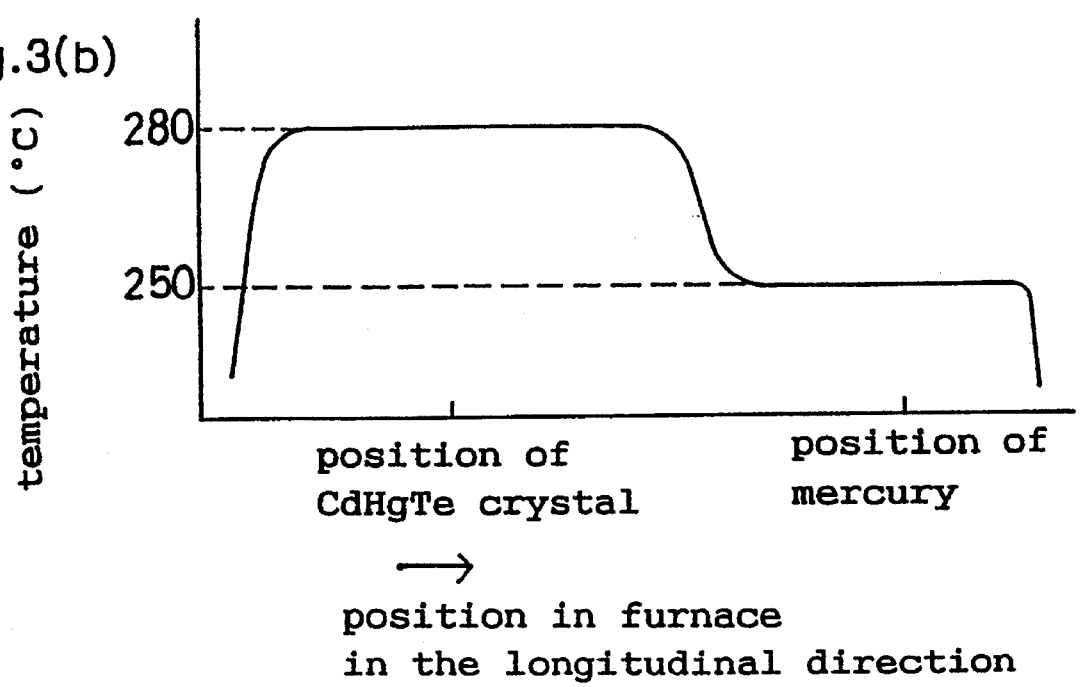

FIGS. 2(a)–2(c) show an LPE apparatus and an LPE method for crystalline-growing CdHgTe on the CdTe substrate 1, and FIGS. 3(a) and 3(b) show an apparatus and a method for annealing an as-grown CdHgTe crystal. Except that the growth melt including Te as a solvent and Cd and Hg as solutes to which indium is added to 0.01 ppm is used, the other elements are the same as those in FIGS. 16(a)–16(c), 17(a), and 17(b). Reference numeral 1a designates an as-grown CdHgTe crystal including indium on the CdTe substrate 3.

A description is given of a production method for the n-type CdHgTe crystal.

Figure 16A:
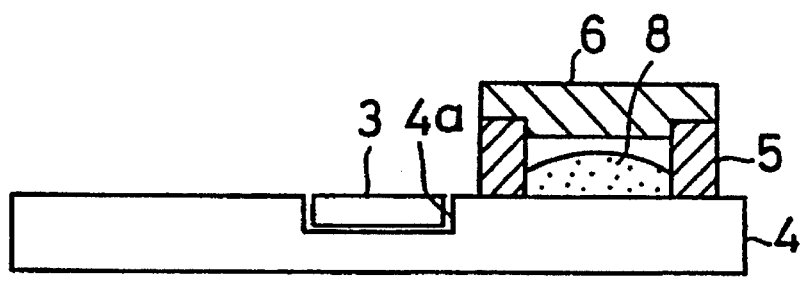
FIGS. 16(a)–16(c) are diagrams illustrating a process for epitaxially growing CdHgTe crystal on a CdTe substrate in production of a photo-conductive type material substrate.
Figure 16B:
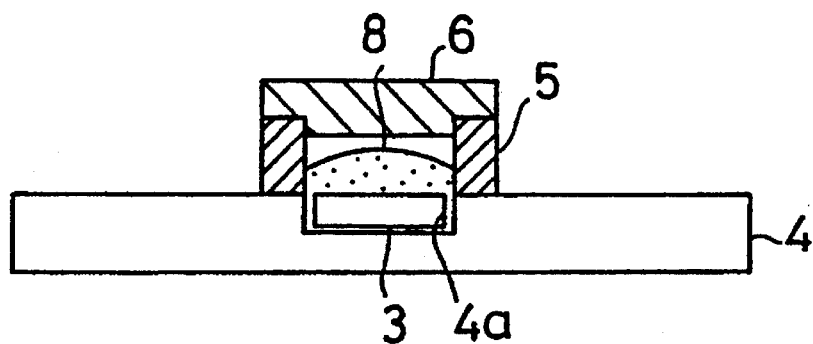
Figure 16C:
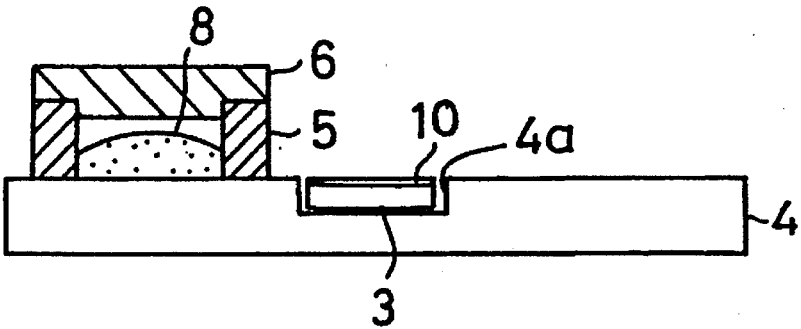
Figure 17A:
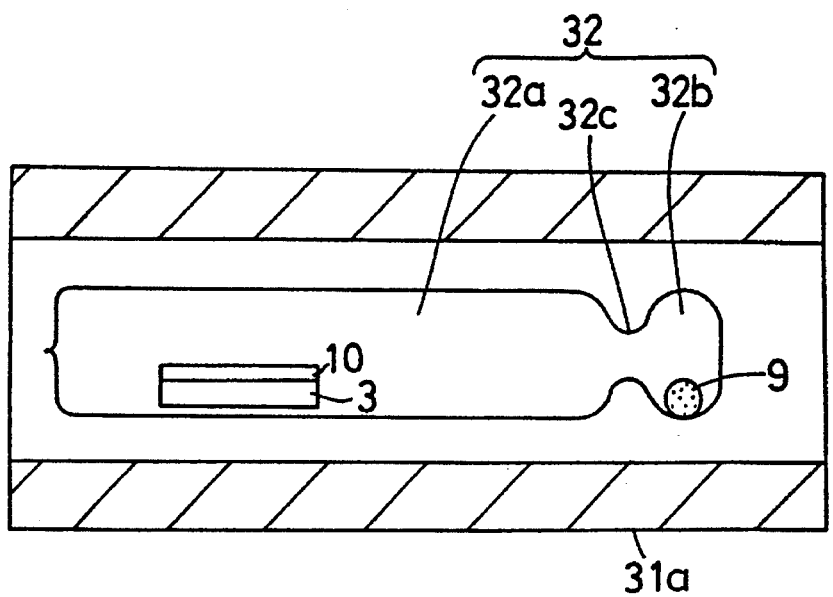
FIGS. 17(a) and 17(b) are diagrams illustrating a process for annealing an as-grown CdHgTe crystal on a CdTe substrate, in the production of the photo-conductive type material substrate.
Figure 17B:
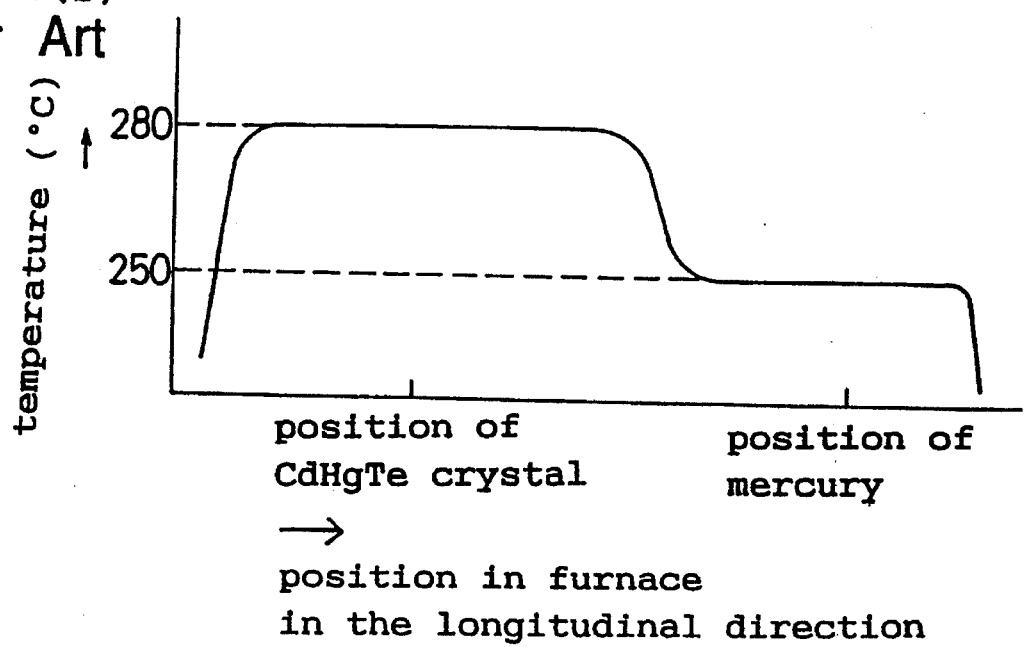

Employing the growth melt 7a including Te as solvent to which Cd and Hg as medium are respectively added to a predetermined amount and further to which indium is added to 0.01 ppm, the as-grown CdHgTe crystal 1a including indium is grown on the CdTe substrate 3 by the same sliding boat method as that shown in FIGS. 16(a) to 16(c) (FIGS. 2(a) to 2(c)).

As shown in FIG. 3(a), the CdTe substrate 3 on the surface of which the as-grown CdHgTe crystal 1a is grown, is enclosed in the substrate containing part 32a of the quartz ampule 32 with mercury 9 contained in the mercury containing part 32b thereof, and then the quartz ampoule 32 is placed in the annealing furnace 31a having a temperature distribution shown in FIG. 3(b), where the abscissa is the position in furnace in the longitudinal direction and the ordinate is temperature. Thereafter, an annealing is performed for 20 hours, whereby the photo-conductive element material substrate 101 is produced.

A description is given of the function and the effect.

Figure 4:
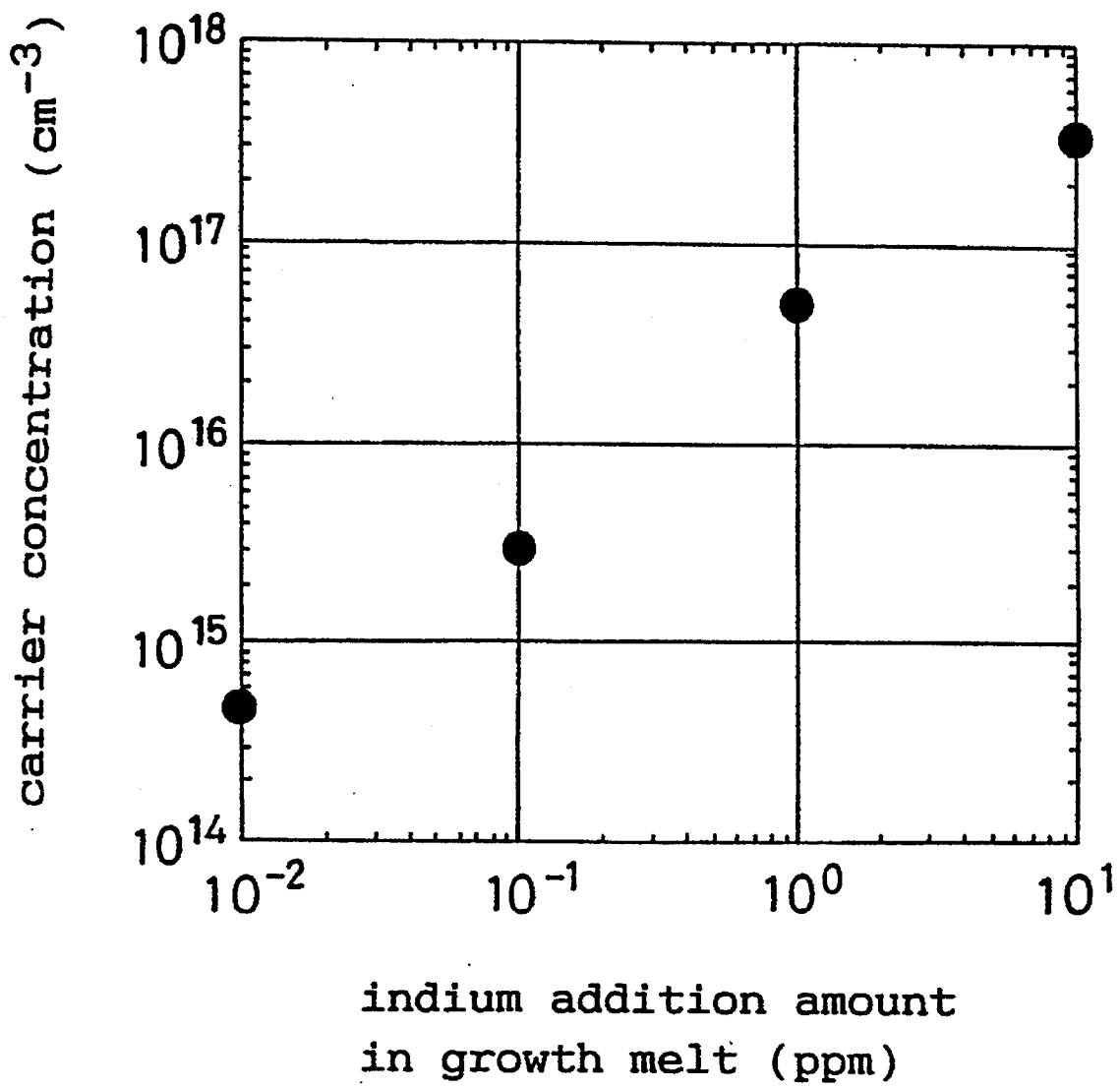
FIG. 4 is a diagram representing a relation between the amount of indium in growth melt and the n-type carrier concentration of the n-type CdHgTe crystal fabricated by using the growth melt including indium, as obtained from experimental data.

An explanation is given of that the amount of indium to be added to the growth melt 7a is approximately 0.01 ppm, with reference to the experimental data shown in FIG. 4.

FIG. 4 shows the indium addition amount (ppm) in the growth melt 7a on the abscissa and the n-type carrier concentration (cm$^{-3}$) of the CdHgTe crystal fabricated by using the growth melt 7a the ordinate for experimental data.

As is apparent from this FIG. 4, the n-type carrier concentration increases with an increase in the indium addition amount, and the n-type carrier concentration is of the order of $10^{14}$ cm$^{-3}$, which is required for the PC element material substrate, is achieved when the indium addition amount is 0.01 ppm.

Figure 5:
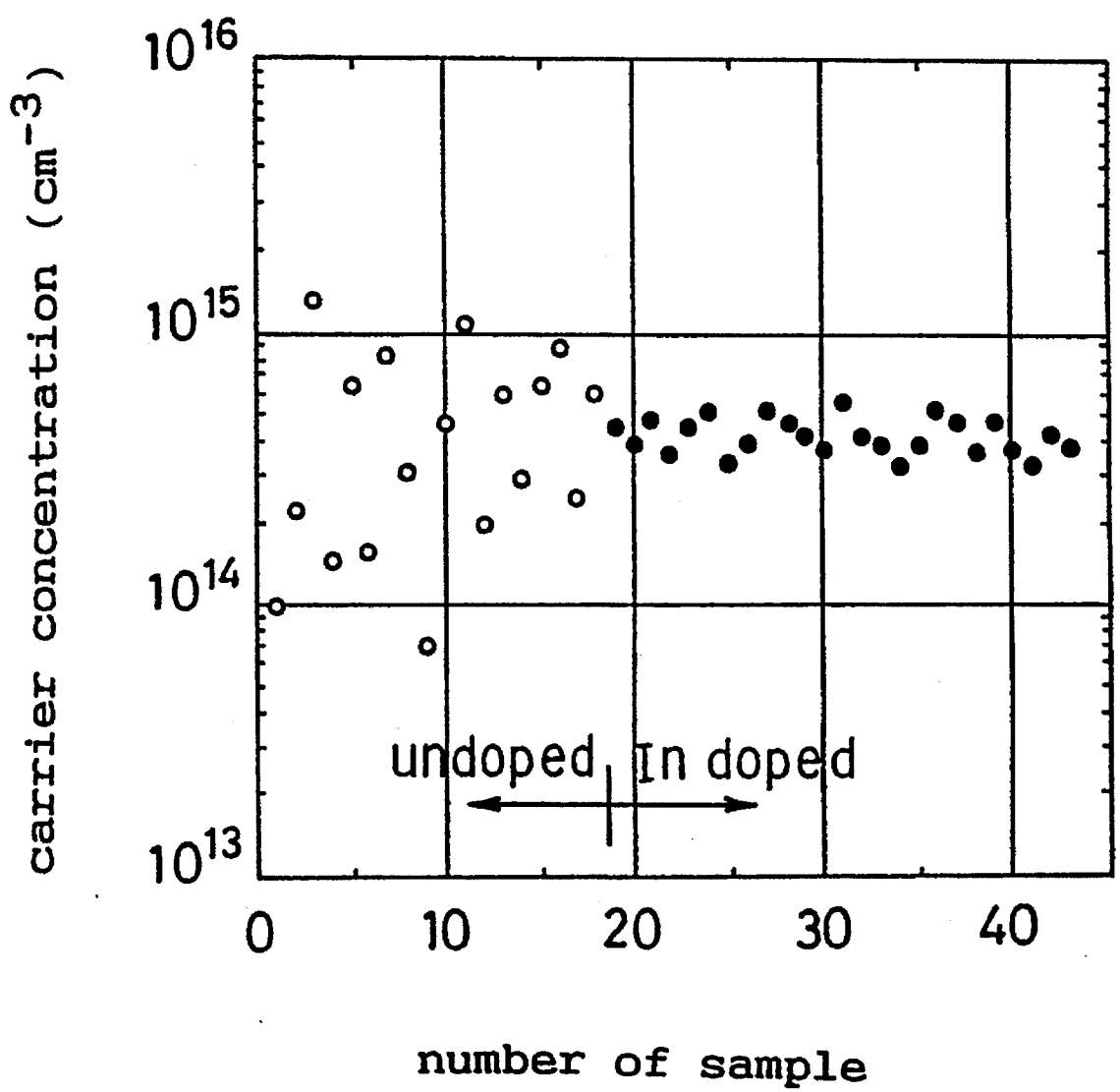
FIG. 5 is a diagram illustrating variations in the n-type carrier concentration in the n-type CdHgTe crystal as obtained from experimental data.

An explanation is given that by adding indium at 0.01 ppm to the growth melt of an n-type CdHgTe crystal, the variations in the carrier concentration from run-to-run are reduced and the reproducibility is enhanced with reference to FIG. 5.

FIG. 5 shows the number of the n-type CdHgTe crystal sample fabricated on the abscissa and the n-type carrier concentration (cm$^{-3}$) in the sample crystal of that number on the ordinate in plotting experimental data, where the mark o represents samples using an undoped growth melt and the mark ● represents samples using an indium doped growth melt.

While the prior art production method of an n-type CdHgTe crystal using the undoped growth melt produces large variations in the n-type carrier concentration, the method using the growth melt to which indium is doped according to the present invention has an n-type carrier concentration in the n-type CdHgTe crystal that is approximately constant in a narrow range of $(4.5\pm1.5)\times10^{14}$ cm$^{-3}$. Accordingly, by employing the growth melt to which indium is added at 0.01 ppm for the fabrication of the n-type CdHgTe crystal, the variations in the n-type carrier concentration can be largely reduced.

In this first embodiment, because crystal growth of CdHgTe is carried out using the growth melt 7a including Te as a solvent to which indium is added as an n-type impurity, and thereafter the as-grown CdHgTe crystal 1a is annealed in a mercury ambient, the mercury atoms+are diffused into the as-grown CdHgTe crystal 1a from the ambient during the annealing and the indium taken into the CdHgTe crystal 1a during the growth is activated as an n-type impurity, whereby this activated indium determines the n-type carrier concentration. Therefore, the n-type carrier concentration of the n-type CdHgTe crystal can be controlled by the indium addition amount within a range of $3\times10^{14}$ cm$^{-3}$ to $6\times10^{14}$ cm$^{-3}$ with high reproducibility without being affected by the deviations in the annealing conditions.

Embodiment 2

Figure 6A:
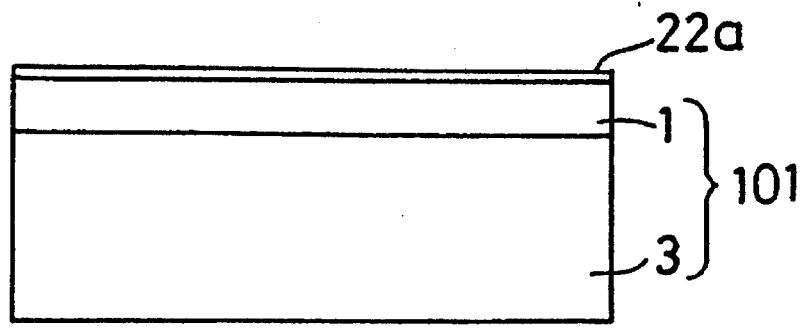
FIGS. 6(a)–6(c) are diagrams for explaining production of a photo-conductive type infrared detector in accordance with a second embodiment of the present invention.
Figure 6B:
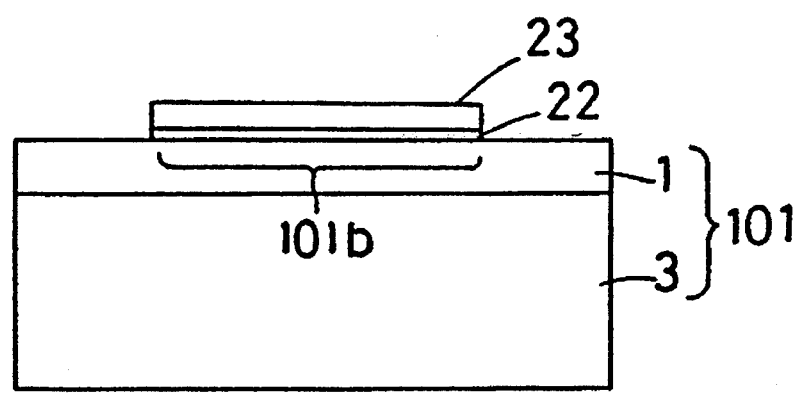
Figure 6C:
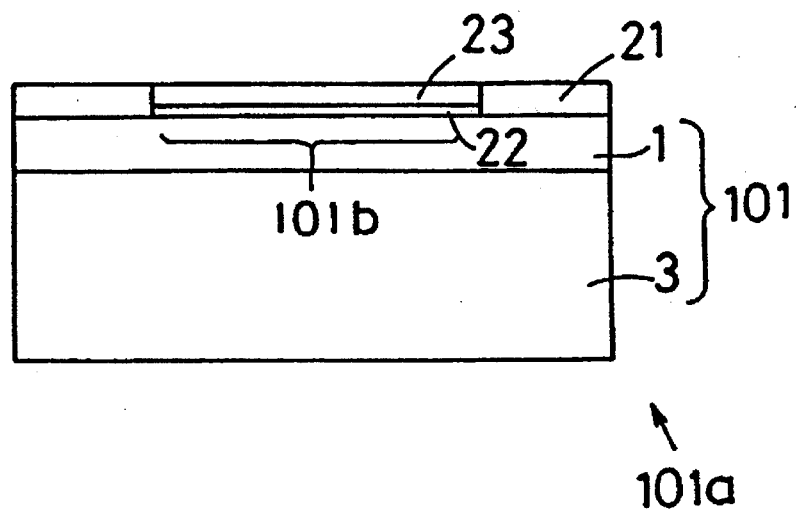
Figure 15A:
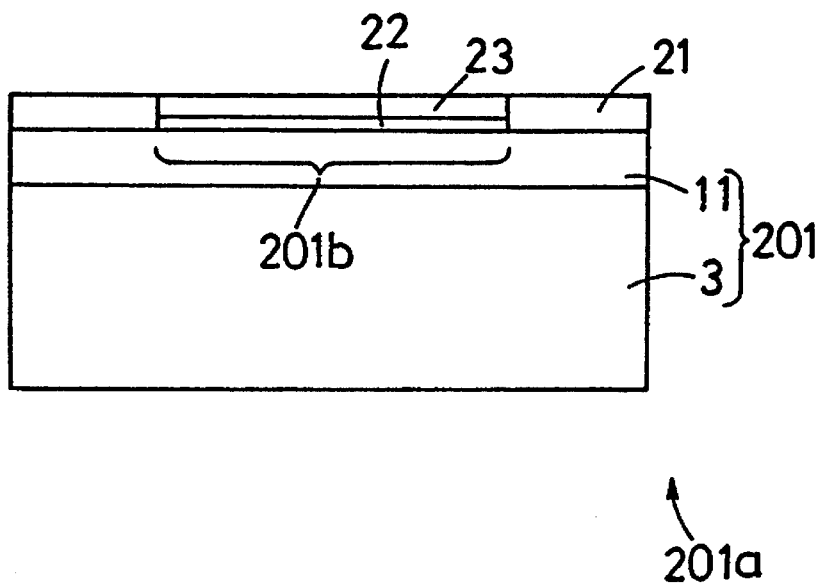
FIGS. 15(a) and 15(b) are cross-sectional views illustrating structures of a photo-conductive type infrared detector and a material substrate fabricated by using a prior art production method of cadmium mercury telluride crystal.
Figure 15B:
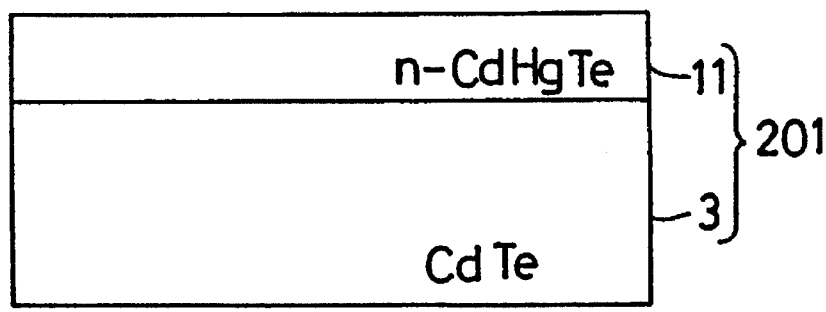

FIGS. 6(a)–6(c) show cross-sectional views for explaining production of an infrared detector according to a second embodiment of the present invention. In the figures, the same reference numerals are used to designate the same or corresponding elements as in FIGS. 15(a) and 15(b). Reference numeral 101a designates a PC-type infrared detector fabricated by using the PC element material substrate 101 of the first embodiment.

A brief description is given of the production method of the PC-type infrared detector.

The passivation film 22a is formed by anodic oxidation of the PC element material substrate 101 that is fabricated as shown in FIGS. 2(a)–2(c), 3(a), and 3(b) (FIG. 6(a)), and thereafter this is patterned, and the ZnS reflection preventing film 23 is selectively formed on the passivation film 22, remaining only on the light receiving region 101b (FIG. 6(b))- The electrodes 21 are produced at both sides of the light receiving region 101b, thereby completing the PC-type infrared detector 101a.

In this second embodiment, the PC-type infrared detector 101a detecting infrared light based upon the change in the resistance of the light receiving region 101b due to the incidence of infrared light is fabricated by using the n-type CdHgTe layer 1 whose n-type carrier concentration is determined by the indium taken in during the-crystal growth. Therefore, the light receiving region 101b is produced on the n-type CdHgTe layer 1 having fewer variations in the n-type carrier concentration, thereby enhancing the production yield.

Embodiment 3

Figure 7:
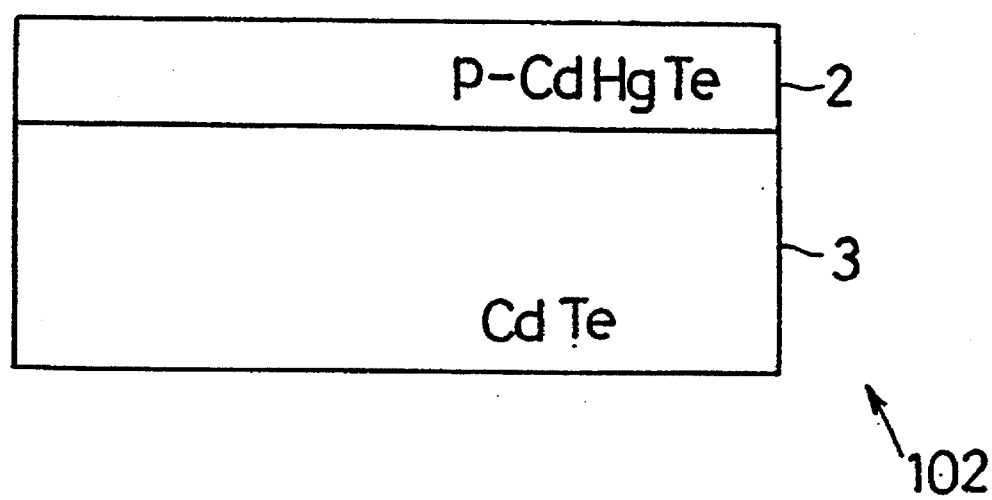
FIG. 7 is a cross-sectional view illustrating a structure of a PV element material substrate produced in accordance with a third embodiment of the present invention.

FIG. 7 illustrates a material substrate of a PV-type infrared detector fabricated by a production method of according to a third embodiment of the present invention. In the figure, reference numeral 102 designates a material substrate for producing a PV-type infrared detector (PV element material substrate), and this comprises a CdTe substrate 3 and a p-type CdHgTe crystal 2 including indium produced thereon.

Figure 8A:
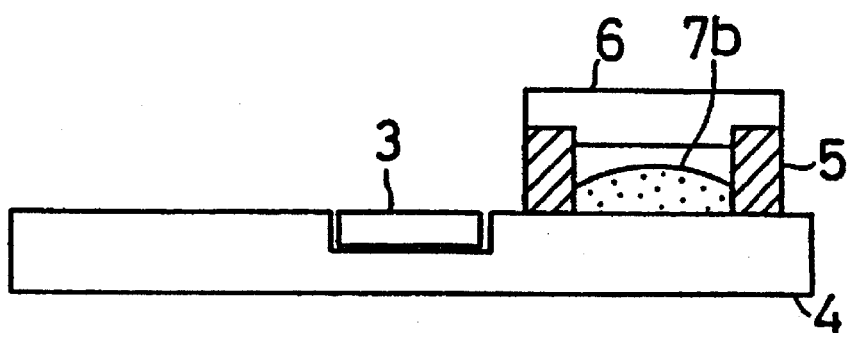
FIGS. 8(a)–8(c) are diagrams illustrating a process for epitaxially growing CdHgTe crystal including indium on a CdTe substrate in the production of the PV element material substrate.
Figure 8B:
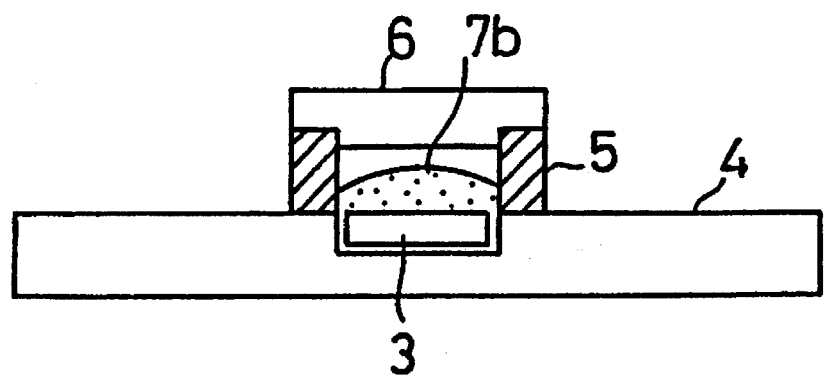
Figure 8C:
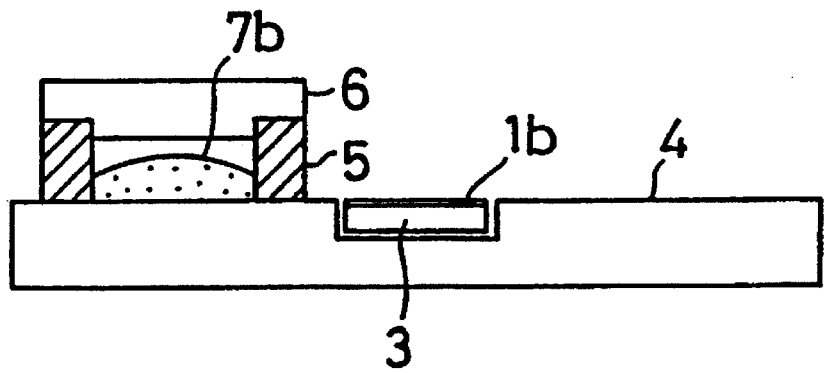
Figure 9A:
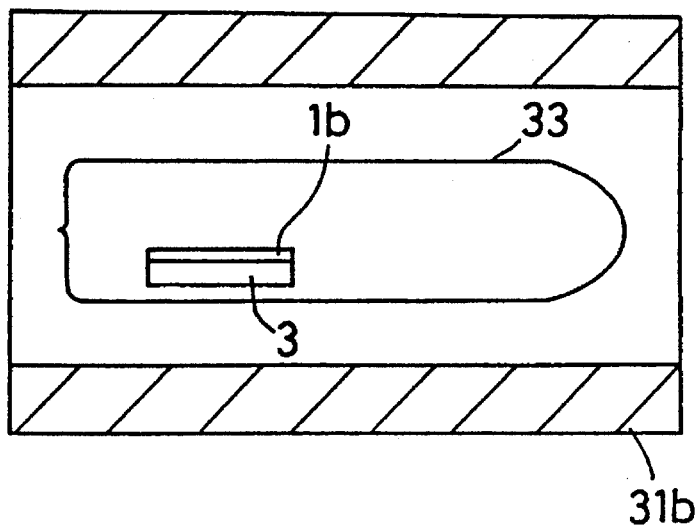
FIGS. 9(a) and 9(b) are diagrams illustrating a process for annealing an as-grown CdHgTe crystal including indium on the CdTe substrate in the production of the PV element material substrate.
Figure 9B:
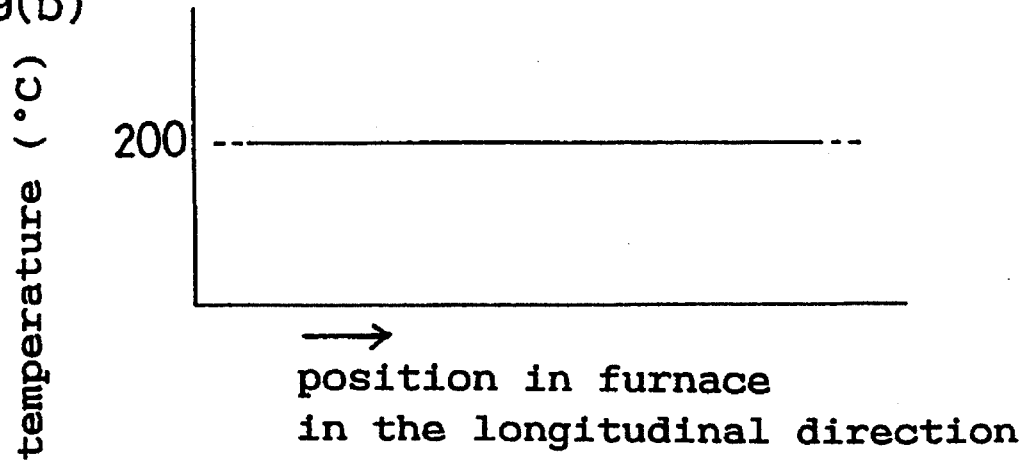

FIGS. 8(a)–8(c) show an LPE apparatus and an LPE method for growing CdHgTe on the CdTe substrate 1, and FIGS. 9(a) and 9(b) show an apparatus and a method for annealing an as-grown CdHgTe crystal. Except that growth melt 7b including Te as a solvent and Cd and Hg as solutes to which indium is added to 0.01 to 0.1 ppm is used as a growth melt, the other constructions are the same as those shown in FIGS. 16(a)–16(c), 19(a), and 19(b). Reference numeral 1b designates an as-grown CdHgTe crystal including indium produced on the CdTe substrate 3.

A description is given of a production method for the p-type CdHgTe crystal.

Employing the growth melt 7b including a Te solvent to which Cd and Hg as solutes are respectively added to a predetermined amount and further to which indium is added to $10^{-2}$ to $10^{-1}$ ppm, the as-grown CdHgTe crystal 1b including indium is grown on the CdTe substrate 3 by the sliding boat method similar to the first embodiment (FIGS. 8(a) to 8(c)).

As shown in FIG. 9(a), the CdTe substrate 3 on the surface of which the as-grown CdHgTe crystal 1b is grown is sealed in vacuum in the quartz ampule 33, and the quartz ampule 33 is placed in the annealing furnace 31b having a temperature distribution shown in FIG. 9(b), where the abscissa is the position in furnace in the longitudinal direction and the abscissa is temperature. Thereafter, an annealing is performed for 20 hours, thereby the PV element material substrate 102 is produced.

A description is given of the function and the effect.

Figure 10:
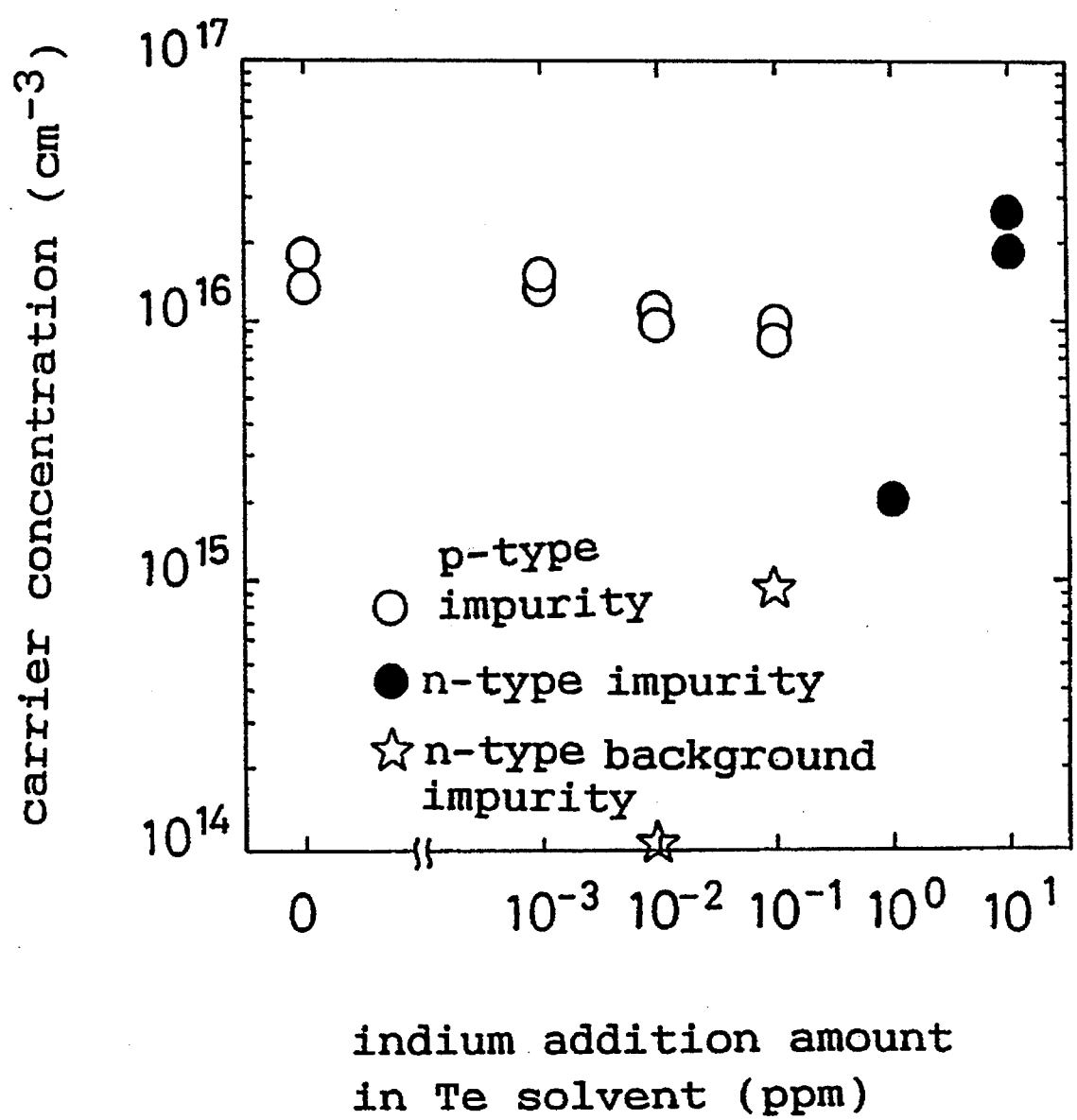
FIG. 10 is a diagram representing a relation between the amount of indium in growth melt and the carrier concentration of the p-type CdHgTe crystal fabricated by using the growth melt including indium, as obtained by experimental data.
Figure 11:
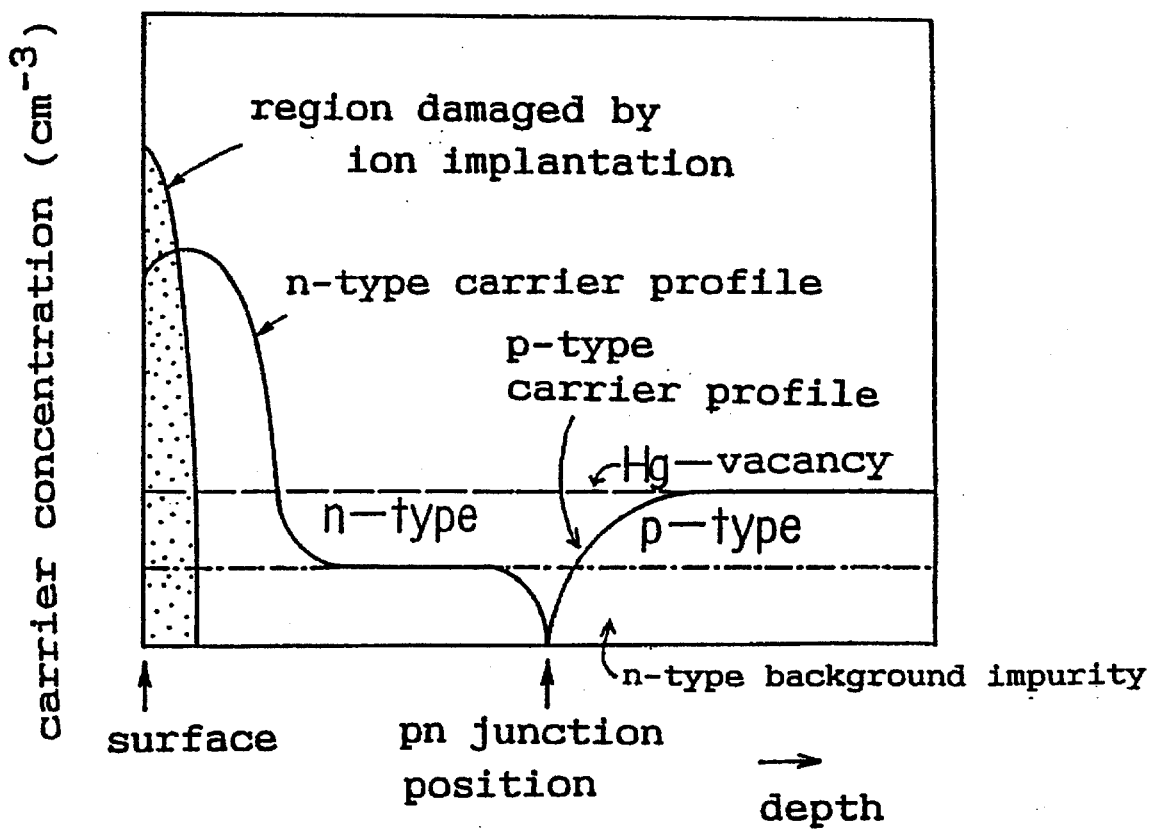
FIG. 11 is a diagram representing a relation between the n-type background impurity in the p-type CdHgTe crystal and the position of a pn junction in the p-type CdHgTe crystal.

An explanation is given of why the addition amount of indium added to the growth melt 7b is appropriately $10^{-2}$ to $10^{-1}$ ppm, with reference to the experimental data shown in FIG. 10.

FIG. 10 shows the indium addition amount in the growth melt 7b on the abscissa and the carrier concentration of the p-type CdHgTe crystal fabricated by using the growth melt 7b on the ordinate, in plotting the experimental data. In FIG. 10, the mark o represents the p-type carrier concentration determining the conductivity type, the mark ● represents the n-type carrier concentration determining the conductivity type, and the mark ☆ represents the concentration of the n-type background impurity.

As is apparent from this FIG. 10, indium is a background impurity when the addition amount thereof is $10^{-2}$ to $10^{-1}$ ppm. In other words, when the addition amount is below that, it becomes close to the carrier concentration in the intrinsic semiconductor ($7\times10^{13}$ $^{cm-3}$) and shows the same behavior as if undoped, presenting no effect of indium addition. When the indium addition amount is above 1 ppm, the carrier concentration of indium determines the conductivity type and the indium does not function as a n-type background impurity.

From this result, it is found that the addition amount of indium is appropriate to be $10^{-2}$ to $10^{-1}$ ppm.

In this third embodiment, because the growth melt 7b including a Te solvent and Hg and Cd solutes and to which indium is added to 0.01 to 0.1 ppm is used as a growth melt for growing the p-type CdHgTe Crystal including indium as an n-type background impurity, the concentration of the n-type background impurity is higher than the carrier concentration of the intrinsic semiconductor in the p-type CdHgTe crystal 2, and is smaller value than the p-type carrier concentration, whereby the p-type $Cd_{0.2}Hg_{0.8}Te$ crystal including indium as a background impurity can be fabricated with high reproducibility.

Embodiment 4

Figure 18A:
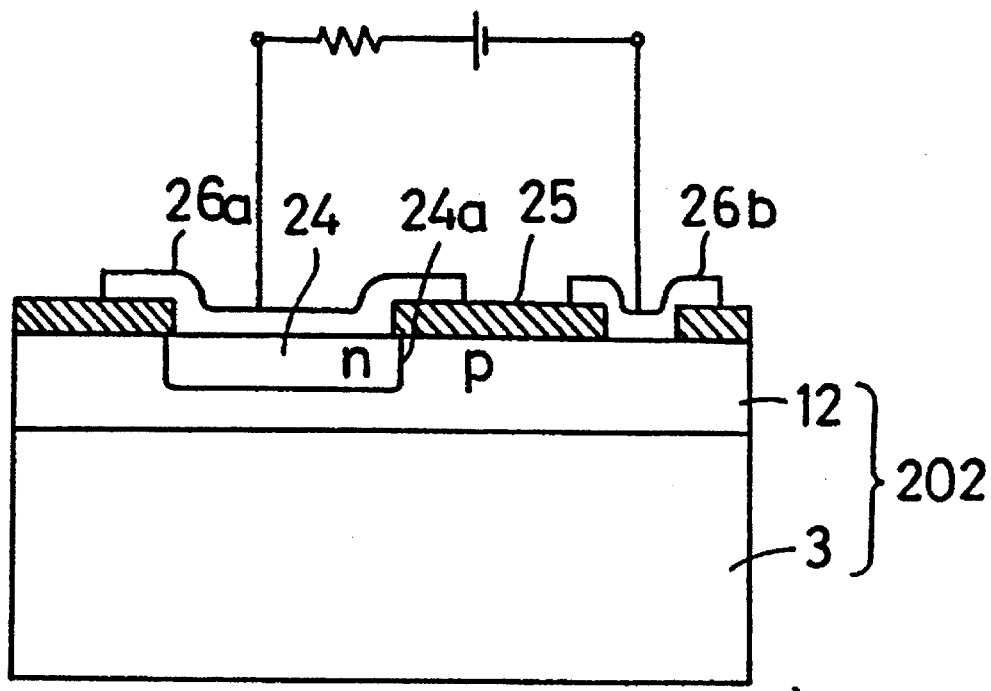
FIGS. 18(a) and 18(b) are cross-sectional views illustrating structures of a photo-voltaic type infrared detector and a material substrate thereof fabricated by using a prior art production method of cadmium mercury telluride crystal.
Figure 18B:
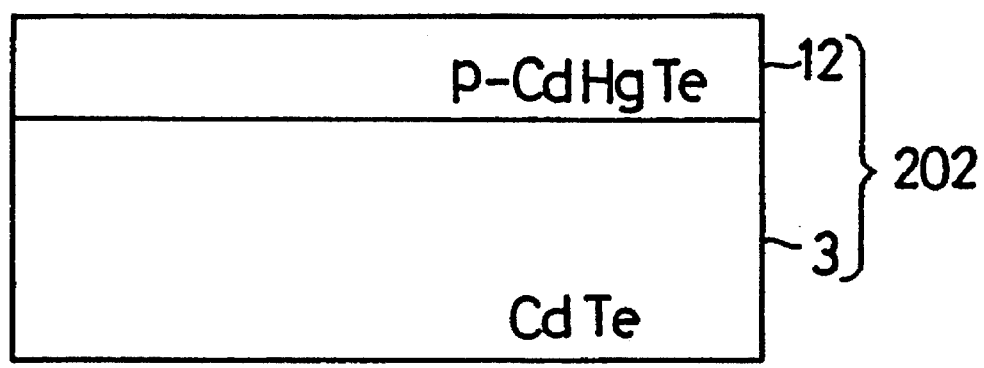
Figure 19A:
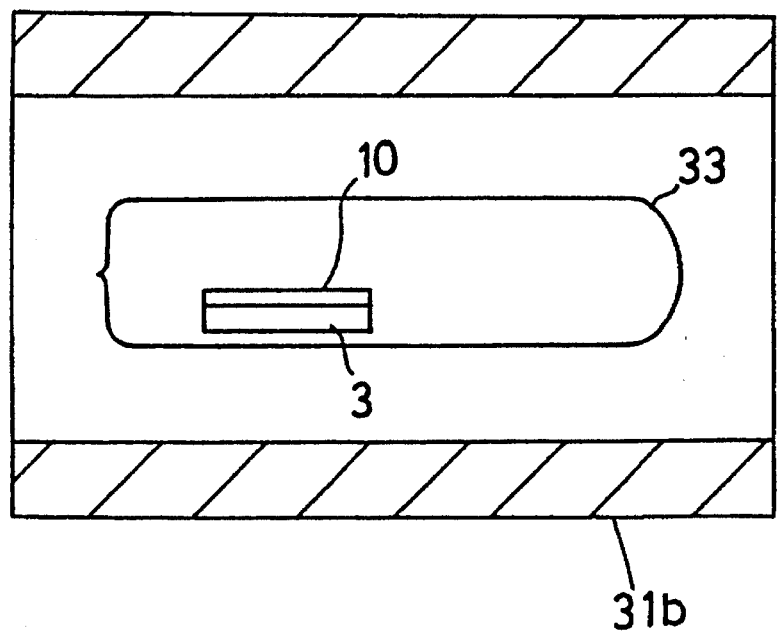
FIGS. 19(a) and 19(b) are diagrams illustrating a process for annealing an as-grown CdHgTe crystal on a CdTe substrate, in the production of a photo-voltaic type material substrate.
Figure 19B:
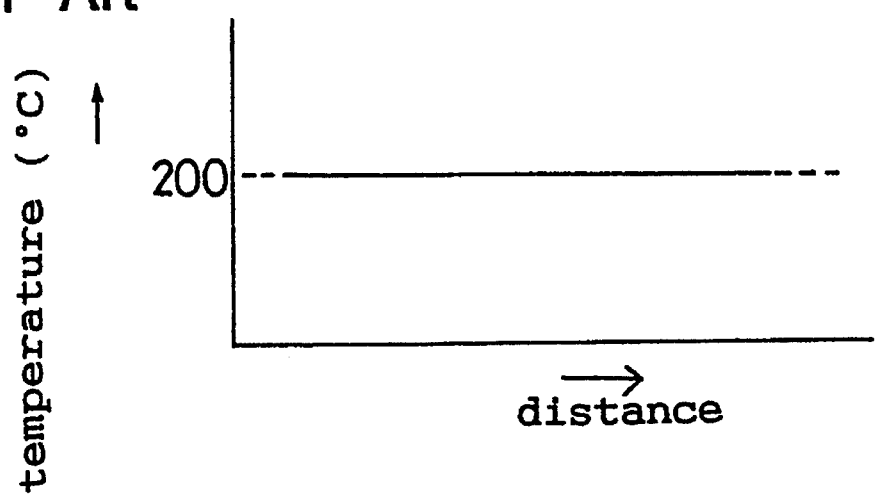

FIGS. 12(a)–12(e) show cross-sectional views for explaining a production method of an infrared detector according to a fourth embodiment of the present invention. In the figures, the same reference numerals are used to designate the same or corresponding elements as those shown in FIG. 18(a) and 18(b). Reference numeral 102a designates a PV-type infrared detector fabricated by using the PV element material substrate 102 of the third embodiment. Reference numeral 28 designates a resist mask for patterning an insulating ion implantation mask.

A brief description is given of the production method of the PV-type infrared detector.

Figure 12A:
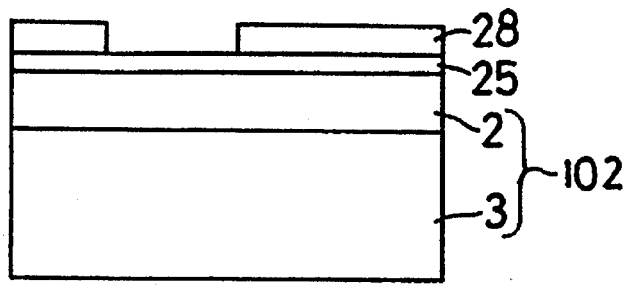
FIGS. 12(a)–12(e) are diagrams for explaining production of a photo-voltaic type infrared detector in accordance with a fourth embodiment of the present invention.
Figure 12B:
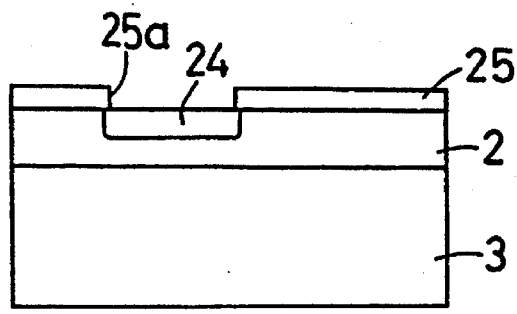

A ZnS film 25 is deposited on the PV element material substrate 102 fabricated as shown in FIGS. 8(a)–8(c), 9(a) and 9(b) FIG. 12(a)), and patterned using the resist mask 28 to produce a first aperture 25a, and thereafter ion implantation of an impurity such as boron is performed using the ZnS film 25 as a mask and, further, an annealing is performed to produce an n-type region 24 (FIG. 12(b)).

Figure 12C:
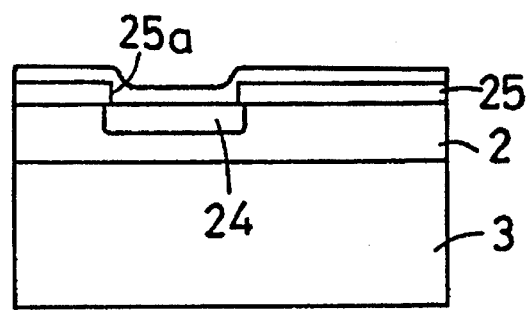
Figure 12D:
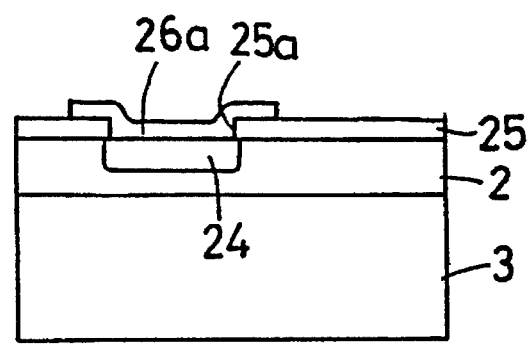
Figure 12E:
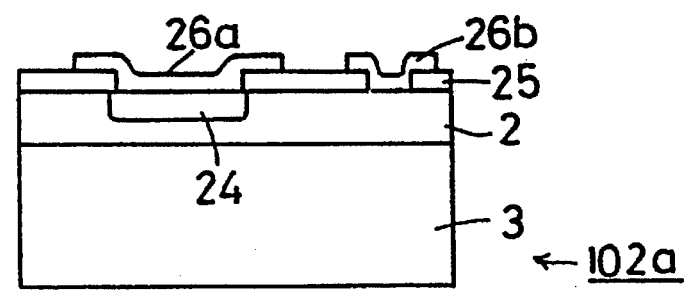

A metal layer 27 having a two-layer structure of Cr/Au is formed at the center surface (FIG. 12(c)), and is patterned, and an n-side electrode 26a is formed on the n-type region 24 (FIG. 12(d)). Then, a second aperture 25b is produced at a portion of the ZnS film 25 a prescribed distance from the n-type region 24, and a p-side electrode 26b is formed on the portion of this aperture 25b, thereby completing the PV-type infrared detector 102a (FIG. 12(e)).

In this fourth embodiment, using the p-type CdHgTe crystal 102 that is produced by using the growth melt 7b to which indium is added to 0.01 to 0.1 ppm as an n-type background impurity, the PV-type infrared detector 102a detecting the incidence of infrared light by a change of the electromotive force at its light receiving region is fabricated. Therefore, a pn junction that is formed by ion implantation of an n-type impurity such as boron followed by annealing can be positioned sufficiently apart from the region at the surface of the p-type CdHgTe layer that is damaged by the ion implantation with high reproducibility, whereby the PV-type infrared detector 102a of an improved characteristics is obtained at high yield.

Figure 13A:
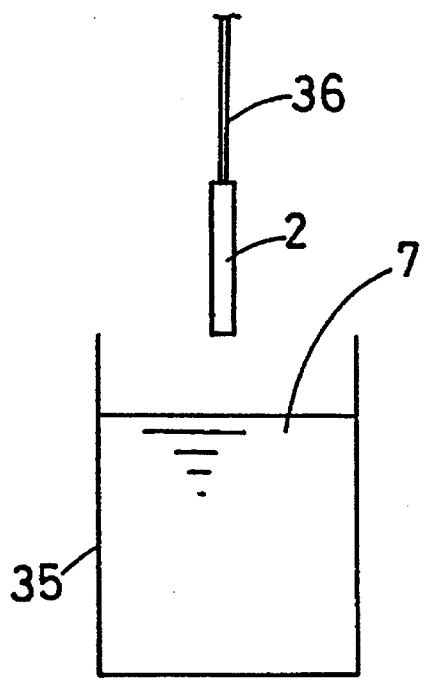
FIGS. 13(a) and 13(b) are diagrams illustrating a method for epitaxially growing a CdHgTe crystal by tipping.
Figure 13B:
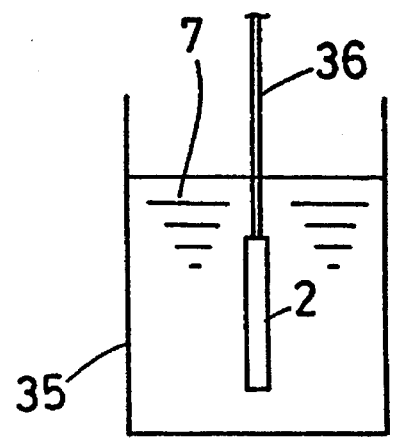
Figure 14A:
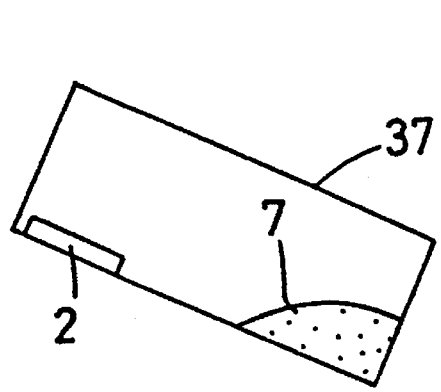
FIGS. 14(a) and 14(b) are diagrams illustrating a method for epitaxially growing a CdHgTe crystal by dipping.
Figure 14B:
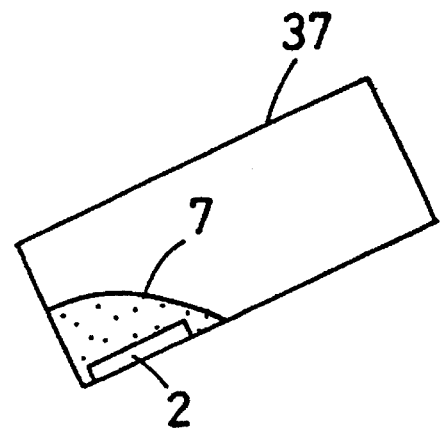

While in the above illustrated embodiments the sliding boat method is employed for the growth of the CdHgTe crystal, the growth method of the CdHgTe crystal may be a dipping method dipping the CdTe substrate 2 attached to a supporting bar 36 in the growth melt 7 contained in a container 35 as shown in FIGS. 13(a) and 13(b). Furthermore, a tipping method may use a growth melt 7 at one end of a container 37 which is inclined in a prescribed direction, the CdTe substrate 2 at the other end as shown in FIG. 14(a). The container 37 is inclined in a reverse direction as shown in FIG. 14(b) thereby to move the CdTe substrate 2 to the side of the growth melt 7, resulting in crystal growth with the same effects as the above described embodiments.

As is evident from the foregoing description, according to the first embodiment of the present invention, because the crystal growth of CdHgTe is carried out using a growth melt including Te as a solvent to which indium as n-type impurity is added to 0.01 ppm and thereafter an annealing is performed in the mercury ambient, the mercury atoms are diffused into the CdHgTe crystal from the mercury ambient during the annealing and the indium taken into the CdHgTe crystal during the growth is activated as n-type impurity thereby to determine the n-type carrier concentration. Therefore, the n-type carrier concentration of the n-type CdHgTe crystal can be controlled by the indium addition amount within a range of $3 \times 10^{14}$ cm$^{-3}$ to $6 \times 10^{14}$ cm$^{-3}$ with high reproducibility without being affected by the deviations in the annealing conditions.

According to the second embodiment of the present invention, because the PC-type infrared detector detecting infrared light based upon the change in the resistance of the light receiving region due to the incidence of infrared light is fabricated by employing the n-type CdHgTe layer whose n-type carrier concentration is determined by the indium taken in during the crystal growth, the PC-type infrared detector is produced on the n-type CdHgTe layer having fewer variations in the n-type carrier concentration, thereby enhancing the production yield.

According to the third embodiment of the present invention, because the p-type CdHgTe crystal including indium as n-type background impurity is produced by growing a CdHgTe crystal using a growth melt including Te as a solvent and Hg and Cd as solutes to which indium is added to 0.01 to 0.1 ppm and performing an annealing in vacuum, the concentration of the n-type background impurity is higher than the carrier concentration of the intrinsic semiconductor in the p-type CdHgTe crystal, and smaller value than the p-type carrier concentration, whereby the p-type $Cd_{0.2}Hg_{0.8}Te$ crystal including indium as a background impurity can be fabricated with high reproducibility.

According to the fourth embodiment of the present invention, because the PV-type infrared detector is fabricated using the p-type CdHgTe crystal that is produced by using a growth melt to which indium is added to 0.01 to 0.1 ppm as an n-type background impurity, the pn junction that is formed by ion implantation of an n-type impurity can be positioned at a desired depth in the p-type CdHgTe layer with high reproducibility, whereby the PV-type infrared detector with improved characteristics is obtained at high yield.

What is claimed is:

1. A method for producing a photo-voltaic infrared detector comprising:

growing a crystalline CdHgTe layer on a CdTe substrate by liquid phase epitaxy using a growth melt including tellurium as a solvent to which indium is added as a dopant impurity from 0.01 to 0.1 ppm;

annealing said CdHgTe layer to produce a p-type CdHgTe layer including indium as an n-type background dopant impurity;

forming an n-type region as a light responsive region in said p-type CdHgTe layer by implanting a dopant impurity producing n-type conductivity and annealing; and forming an n-side electrode on said n-type region and a p-side electrode spaced from said n-type region on said p-type CdHgTe layer.

* * * * *